United States Patent [19]

Shiota

[11] 4,409,726
[45] Oct. 18, 1983

[54] METHOD OF MAKING WELL REGIONS FOR CMOS DEVICES

[76] Inventor: Philip Shiota, 14270 Old Wood Rd., Saratoga, Santa Clara, Calif. 95070

[21] Appl. No.: 366,511

[22] Filed: Apr. 8, 1982

[51] Int. Cl.³ .......................................... H01L 21/265
[52] U.S. Cl. .................................... 29/571; 29/576 B; 29/578; 148/187
[58] Field of Search ..................... 29/571, 578, 576 B; 148/187, 1.5

[56] References Cited

U.S. PATENT DOCUMENTS

| Re. 31,079 | 11/1982 | Nagasawa et al. | 148/187 X |
|---|---|---|---|
| 3,876,472 | 4/1975 | Polinsky | 148/1.5 |
| 3,921,283 | 11/1975 | Shappir | 29/571 |
| 4,013,484 | 3/1977 | Boleky et al. | 148/187 X |
| 4,027,380 | 6/1977 | Deal et al. | 29/578 X |
| 4,045,250 | 8/1977 | Dingwall | 148/187 X |
| 4,295,266 | 10/1981 | Hsu | 29/576 B |
| 4,314,857 | 2/1982 | Aitken | 148/187 X |
| 4,315,781 | 2/1982 | Henderson | 148/187 X |

*Primary Examiner*—G. Ozaki
*Attorney, Agent, or Firm*—Alan H. MacPherson; Steven F. Caserza; Richard Franklin

[57] ABSTRACT

This invention significantly reduces the problem of undesired lateral diffusion of P type dopants into the P type active area. A thin oxide/nitride sandwich is formed on the surface of a semiconductor wafer and patterned to serve as a mask defining the to-be-formed active areas. An N type dopant implant is performed on the surface of the wafer to establish the desired field inversion threshold voltage. The wafer is then oxidized, with the oxide/nitride sandwich preventing oxide growth in the active areas. A layer of photoresist is applied to the wafer and patterned to expose the to-be-formed P well. That portion of the oxide exposed by the photoresist is removed, as is that portion of the substrate within the to-be-formed P well which contains N type dopants. P type impurities are then applied to the wafer. The photoresist is then removed and the P type dopants are diffused with little oxide growth to provide a P well having the desired dopant profile. Following this diffusion, a second, heavy concentration of P type dopant is implanted into the wafer at a sufficiently low energy to prevent the introduction of dopants into those portions of the wafer which are masked by the field oxide and the oxide/nitride sandwich areas. The oxide/nitride sandwich and the field oxide serve as masks, thus preventing the introduction of P type dopants in the field region or the active regions. Thus, the high concentration of P type dopants are introduced only in the periphery of the P well. The field oxide along the periphery of the P well is then regrown at a lower temperature than typically used for growing field oxide and diffusing dopants, thereby preventing substantial diffusion of the P type dopants. Thus, an active area within a P well is thereby formed wherein the width of the active area is not decreased due to P type dopant encroachment from the heavily doped periphery of the P well.

5 Claims, 8 Drawing Figures

METHOD OF MAKING WELL REGIONS FOR CMOS DEVICES

BACKGROUND OF THE INVENTION

1. Field of the Invention

This invention relates to a method for fabricating complementary metal oxide silicon (CMOS) semiconductor devices having small geometries, as well as the devices produced by said method.

2. Description of the Prior Art

A typical prior art method for fabricating CMOS devices is depicted by the cross-sectional views of FIGS. 1a through 1c. As shown in FIG. 1a, substrate 11 typically comprises a silicon wafer having crystal orientation <100> and resistivity of approximately 3-5 ohm-cm. Upon the entire top surface of substrate 11 is formed a layer of oxide 12. Oxide 12 is typically formed to a thickness of approximately 500 Å, by a 40 minute thermal oxidation in 1000° C. wet oxygen. A layer of silicon nitride 13, having a thickness of approximately 1500 Å is formed on the surface of oxide 12. Silicon nitride layer 13 is typically formed by low pressure chemical vapor deposition, as is well known in the semiconductor arts, and described, for example, by Rosler in an article entitled "Low Pressure CVD Production Processes for Poly, Nitride, and Oxide", *Solid State Technology*, April 1977, pages 63-70 and by Brown and Kamins in an article entitled "An Analysis of LPCVD System Parameters for Polysilicon, Silicon Nitride and Silicon Dioxide Deposition", *Solid State Technology*, July 1979, pages 51-57.

Using suitable photolithographic techniques well known in the semiconductor art, oxide layer 12 and nitride layer 13 are patterned to mask the active areas 99a and 99b, while exposing the remainder of the surface of the wafer, as shown in FIG. 1a. This patterning is typically accomplished by etching those portions of silicon nitride layer 13 which are unprotected by the photolithographic mask with a $CF_4$ plasma. Portions of oxide layer 12 which are exposed by the removal of portions of silicon nitride layer 13 are then removed, such as by etching in buffered hydrofluoric acid.

An implant of N type dopants is typically performed in order to establish the field threshold voltage at a desired level. For example, arsenic ions are implanted into the top surface of substrate 11, thus forming N doped regions 14. Of importance, the sandwich formed by oxide 12 and nitride 13 act as a mask, thus preventing the implantation of arsenic dopants into the active regions 99a and 99b.

As shown in FIG. 1b, a layer of photoresist 15 is applied to the surface of the wafer, and patterned to expose the to-be-formed P well 16. P well 16 is then formed, for example, by the implantation of boron atoms at 100 KEV. Of importance, photomask 15 absorbs the boron ions, thus preventing the implantation of boron ions into that portion of substrate 11 which is protected by photoresist 15, thereby selectively forming P well 16 within substrate 11.

Photoresist 15 is then removed. The arsenic dopants in N type region 14, and the boron dopants in P well 16 are then diffused at high temperature, thus establishing the desired dopant concentration profile. Field oxide 17 is formed by oxidizing those portions of the surface of substrate 11 which are not masked by the oxide/nitride sandwich formed by oxide regions 12 and nitride regions 13. Field oxide 17 is thermally grown by subjecting the wafer to wet oxygen (wet oxygen used for the growth of oxide typically comprises approximately 70% $H_2O$ and 30% $O_2$) at approximately 1100° C. for approximately 200 minutes. The thickness of the field oxide is typically 1.2 microns.

During the dopant drive and the field oxide growth, arsenic diffuses both downwardly and, unfortunately, outwardly into the active area 99a. This effectively reduces the width W of the active area 99a, thus requiring that the active area 99a be originally defined by oxide 12 and nitride 13 to be larger than the desired channel width $W_N$. Thus, the N channel width is originally defined to width $X_N$, and is reduced to width $W_N$ by lateral diffusion of the arsenic dopants. Thus, $(X_N - W_N)$ is the tolerance required when originally defining the active area 99a in order to be assured of an active area having width $W_N$. This tolerance $(X_N - W_N)$ is essentially wasted space on the surface of the wafer.

A similar problem of wasted space occurs in the formation of active area 99b. Because the oxide/nitride sandwich formed by oxide region 12 and nitride region 13 remains on the surface of the wafer when the P type implantation is performed, the oxide/nitride sandwich absorbs some of the P type boron dopants, thus resulting in a P well 16 having a lower dopant concentration in the active region 99b than in the remainder of P-well 16. Higher P type dopant concentrations in the periphery of P well 16 is desirable in order to provide increased isolation between adjacent devices, such as between the N channel device to be formed in active area 99a and the P channel device to be formed in active area 99b. During the high temperature diffusion and field oxide growth, the higher P type dopant concentration in the periphery of P well 16 is not only diffused downwardly and outwardly (away from active area 99b) but also diffused inwardly, thus encroaching on active area 99b. This encroachment, shown by the dashed line in FIG. 1c, effectively reduces the width of the active area 99b. Thus, the active area 99b must be originally defined by oxide region 12 and nitride region 13 to be of width $X_p$, which is greater in width than the desired width $W_p$ of the active area 99b. As in the case with active area 99a, this tolerance $(X_p - W_p)$ associated with the formation of active area 99b is wasted space on the semiconductor surface. As will be appreciated by those of ordinary skill in the semiconductor art, the actual values of the encroachment tolerance $(X_p - W_p)$ is dependent on specific processing parameters, including dopant levels and the amount of dopant diffusion occurring due to diffusion and oxidation steps.

SUMMARY

This invention significantly reduces the problem of undesired lateral diffusion of P type dopants into the P type active area. In accordance with this invention, a thin layer of oxide is formed on the surface of a semiconductor wafer, and a thin region of nitride is formed on the surface of the thin oxide layer. The oxide and nitride layers are patterned to serve as a mask defining the to-be-formed active areas. An N type dopant implant is performed on the surface of the wafer, with the N type dopants being masked by the oxide/nitride sandwich and the N type dopants being implanted into all exposed areas of the wafer. This N type implant serves to establish the desired N type field inversion threshold voltage. The wafer is then oxidized, with the oxide/nitride sandwich preventing oxide growth in the active areas. A layer of photoresist is applied to the wafer and patterned to expose the to-be-formed P well. That portion of the oxide exposed by the photoresist is removed, as is that portion of the substrate within the to-be-formed P well which contains N type dopants. P type impurities are then applied to the wafer to a lower dosage than required in prior art devices where the portion of the substrate within the P well containing N type dopant has not been removed by etching because a higher P type dosage is not required to counteract the presence of N type dopants, as is the case in prior art devices. The photoresist is then removed and the P type dopants are diffused with little oxide growth to provide a P well having the desired dopant profile. Following this diffusion, a second, heavy concentration of P type dopant is implanted into the wafer at a sufficiently low energy to prevent the introduction of dopants into those portions of the wafer which are masked by the oxide/nitride sandwich areas. The nitride and the oxide covering the N type region serve as masks, preventing the introduction of P type dopants in the N type field region or the active regions. Thus, the high concentration of P type dopants are introduced only in the periphery of the P well. The field oxide for all regions not protected by nitride is then regrown at a lower temperature than typically used for growing field oxide and diffusing dopants. Thus, the high concentration of P type dopants are not substantially diffused during this growth of field oxide, and thus do not encroach on the active area within the P well. In accordance with this invention, an active area within a P well is thereby formed wherein the width of the active area is not decreased due to P type dopant encroachment from the heavily doped periphery of the P well.

DETAILED DESCRIPTION

Figure 1A:
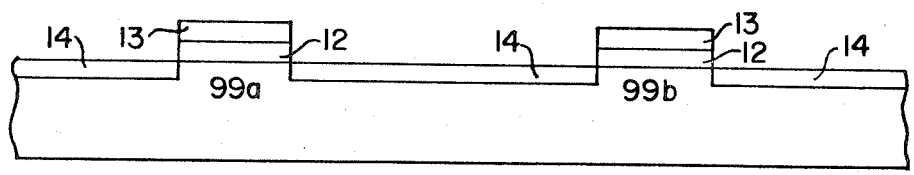
FIGS. 1a through 1c show a cross-sectional view of a prior art CMOS device.
Figure 1B:
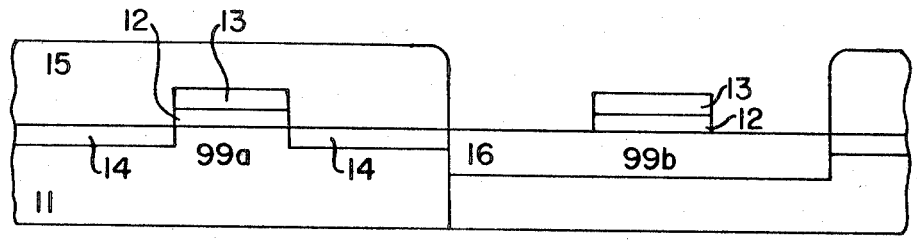
Figure 1C:
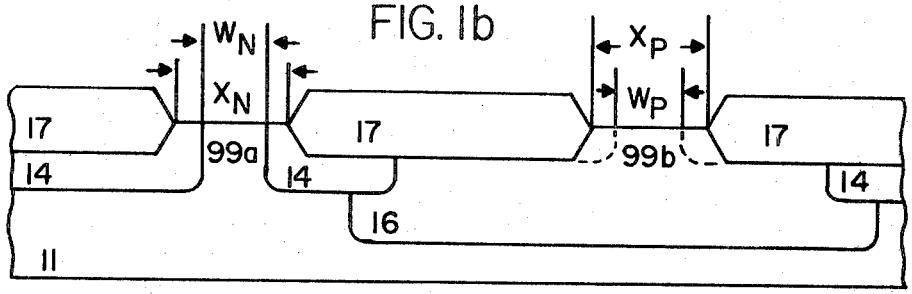
Figure 2A:
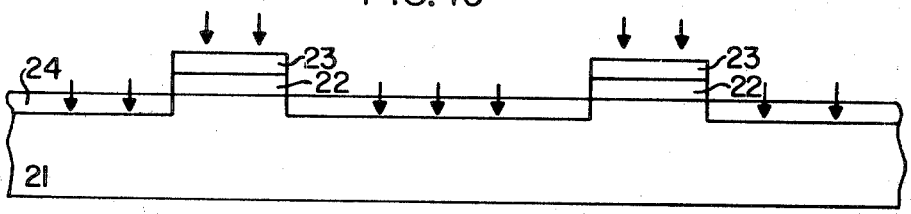
FIGS. 2a through 2e are cross-sectional views of a CMOS device fabricated in accordance with this invention.

Referring to FIG. 2a, substrate 21 comprises a silicon wafer of crystal orientation <100> and resistivity of approximately 4 ohm-cm. A layer of oxide 22 is formed on the surface of the wafer to a thickness of approximately 500 Å by, for example, thermal oxidation in wet oxygen for approximately 40 minutes at approximately 1000° C. Silicon nitride layer 23 is formed on the surface of oxide layer 22 to a thickness of approximately 1500 Å by, for example, low pressure chemical vapor deposition. Oxide layer 22 and nitride layer 23 are then patterned to define the active areas of the device. For example, suitable well-known photolithographic techniques are employed, wherein a layer of photoresist serving as a mask protects the oxide layer 22 and nitride layer 23 in those portions of the wafer surface which are to form the active device areas. The exposed portions of nitride layer 23 are then removed, such as by etching with a $CF_4$ plasma. Following the removal of the portions of nitride layer 23 which are exposed by the photoresist, the portions of oxide layer 22 which are exposed by the patterned nitride layer 23 are then removed, such as by chemical etching in a buffered hydrofluoric acid solution.

The field threshold voltage may be adjusted by an introduction of N type dopants into those portions of the wafer which are not masked by the patterned oxide-nitride sandwich 125, thereby forming regions 24. For example, arsenic ions may be implanted at an energy level of approximately 40 KEV, to a dosage of approximately $7 \times 10^{11}$ ions/cm$^2$ thus resulting (after diffusion of the arsenic ions during the remaining process steps) in a field threshold voltage of approximately 15 volts.

Figure 2B:
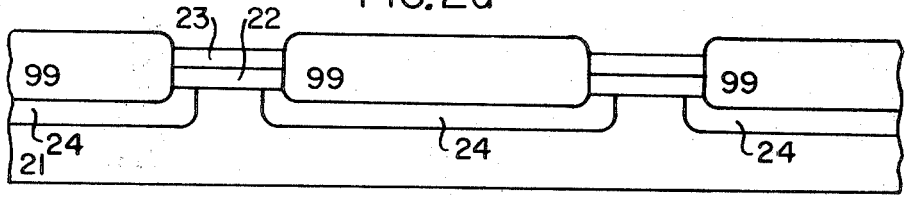
Figure 2C:
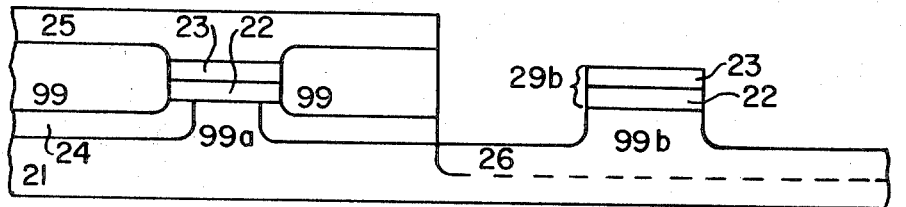
Figure 2D:
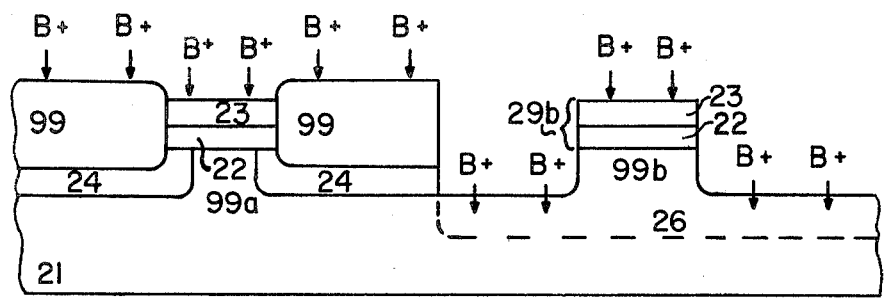

The wafer is then subjected to thermal oxidation in wet oxygen at a temperature of 1000° C. for approximately 200 minutes, thus forming on the surface of the wafer which is unprotected by the patterned nitride-oxide sandwich 29a or 29b field oxide 99 having a thickness of approximately one micron. As shown in FIG. 2b, the arsenic dopants within regions 24 diffuse slightly during this field oxide growth.

As shown in FIG. 2b, the surface of the wafer is covered with a photoresist layer 25. Photoresist layer 25 is patterned to expose the to-be-formed P well 26 while remaining as a protective layer over all other areas of the wafer surface. The portions of field oxide 99 which are not protected by photoresist layer 25 are then removed, for example, by etching in buffered hydrofluoric acid. Of importance, the oxide/nitride sandwich 29b prevents etching in active area 99b. Following the removal of the portion of thermal oxide which is unprotected by photoresist 25, a silicon etchant (e.g. a mixture of nitric, hydrofluoric, and acetic acids well known in the semiconductor processing art) is applied to the wafer, thereby removing the silicon region 24 (which contains N type dopants) from the to-be-formed P well 26. In this manner, the N type dopants are removed from the P well area, thus eliminating the need for increasing the dosage of P type dopants within the to-be-formed P well, as is required in prior art devices in order to counteract the effect of the N type dopants present within the to-be-formed P well.

P type dopant (for example, boron) is now implanted at a high energy level (for example, 100 KEV) so that the P type dopant penetrates the oxide/nitride sandwich in order to dope the entire P well area. The P well photoresist is then removed and the implanted P type dopant diffused into the substrate in a well known manner in order to provide a P well having the desired dopant profile. This diffusion is performed in such a manner as to provide very little oxide growth (i.e. less than about 500 Å). For example, this diffusion is performed in an ambient of predominantly nitrogen gas with a very small amount of oxygen (i.e. approximately 98% $N_2$ and 2% $O_2$).

Following the diffusion of the P well dopant, a relatively heavy P type field doping is provided in the P well periphery. P type dopants are applied to the wafer, for example, by an implantation of boron. When boron ions from a $BF_2$ source are used as the P type dopant, a low implantation energy of approximately 40 KEV is utilized. Utilizing a low energy ion implant, boron ions are implanted in the exposed portions of the wafer forming the periphery of P well 26, while the ions are absorbed by field oxide 99 and the oxide/nitride sandwich 29b overlying the active areas of the P well 26.

Figure 2E:
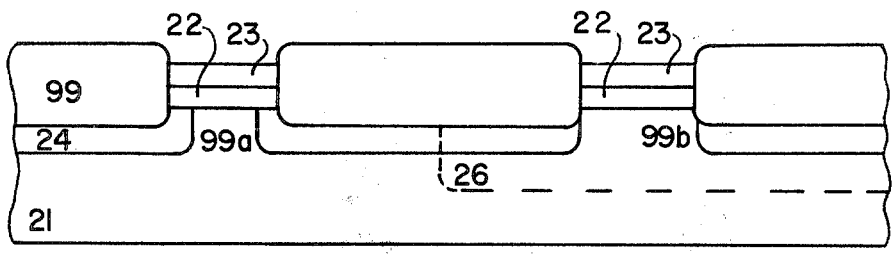

As shown in FIG. 2e, the field oxide is regrown on the field (i.e., periphery) of P well 26. This field oxide is regrown to a thickness of approximately one micron by thermal oxidation in wet oxygen at approximately 1000° C. for approximately 200 minutes. During this regrowth of the field oxide over the periphery of P well 26, the field oxide on the surface of the wafer between oxide/nitride sandwich 29a and P well 26 is further oxidized to a final thickness of approximately 1.4μ.

Because the field oxide above the periphery of P well 26 is regrown in approximately 200 minutes at 1000° C., which produces significantly less diffusion of the P well dopants as compared with prior art dopant diffusions when fabricating CMOS devices, the relatively heavy boron impurities around the periphery (field region) of the P well 26 are not substantially diffused toward the P channel active area 99b. Thus, the width of the relatively lightly doped P channel active area 99b remains substantially the same as the width of nitride/oxide sandwich 29b, which is used during the formation of the P well to define the P channel active area 99b. Accordingly, the wasted space associated with the tolerance $(X_p - W_p)$ required to insure a minimum width $W_p$ of the active area 99b of P well 26 is eliminated, thus resulting in a more compact device, and an associated increase in the density of integrated circuit devices constructed in accordance with this invention, as compared with the prior art.

While specific embodiments have been disclosed in this specification, these embodiments are merely illustrative of my invention and are not to be construed as limitations of my invention. Other embodiments of my invention will become apparent to those skilled in the art in light of the teachings of my invention.

I claim:

1. The method of forming a well region of a first conductivity type within a substrate of a second conductivity type opposite said first conductivity type comprising the steps of:

forming a layer of oxide on said substrate;
forming a layer of nitride on said layer of oxide;
patterning said layers of oxide and nitride to define the to-be-formed active regions;
introducing dopants of said second conductivity type into said substrate other than in said to-be-formed active regions;
forming field oxide on said substrate other than in said to-be-formed active regions;
forming a mask on said substrate defining the to-be-formed well region;
removing that portion of said field oxide which lies within said to-be-formed well region;
removing that portion of said substrate within said to-be-formed well region which contains said dopants of said second conductivity type;
introducing dopants of said first conductivity type into said to-be-formed well region; and
forming field oxide within said well region other than in said active area, wherein said field oxide within said well region is formed at a low temperature, thereby preventing substantial diffusion of said dopants of said first conductivity type.

2. Method as in claim 1 wherein said step of introducing dopants of said first conductivity type comprises:

introducing a first low dosage of dopants of said first conductivity type into said well region;
diffusing said first dosage of dopants, thereby forming said well region of desired dopant profile; and
introducing a second, heavy dosage of dopants of said first conductivity type into the periphery of said well region.

3. Method as in claim 2 wherein said first conductivity type is P and said second conductivity type is N.

4. Method as in claim 3 wherein said first dosage of dopants is introduced by the low implantation of boron at approximately 100 KEV.

5. Method as in claim 3 wherein said second dosage of dopants is introduced by the ion implantation of boron at approximately 40 KEV.

* * * * *